United States Patent
Hailu et al.

(10) Patent No.: US 9,971,312 B1
(45) Date of Patent: May 15, 2018

(54) PULSE TO DIGITAL CONVERTER

(71) Applicant: QUALCOMM Incorporated, San Diego, CA (US)

(72) Inventors: Eskinder Hailu, Cary, NC (US); Bupesh Pandita, Raleigh, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/644,285

(22) Filed: Jul. 7, 2017

(51) Int. Cl.
*H03M 1/50* (2006.01)
*G04F 10/00* (2006.01)
*H03K 3/03* (2006.01)
*G11C 19/00* (2006.01)
*H03K 3/037* (2006.01)

(52) U.S. Cl.
CPC ............ *G04F 10/005* (2013.01); *G11C 19/00* (2013.01); *H03K 3/037* (2013.01); *H03K 3/0315* (2013.01)

(58) Field of Classification Search
CPC .... G04F 10/005; H03K 3/037; H03K 3/0315; G11C 19/00
USPC ......................................................... 341/166
See application file for complete search history.

(56) References Cited

U.S. PATENT DOCUMENTS

| 8,065,102 B2 | 11/2011 | Kojima |
| 8,138,843 B2 | 3/2012 | Straayer et al. |
| 8,447,548 B2 | 5/2013 | McKay et al. |
| 9,124,280 B2* | 9/2015 | Kim ...................... G04F 10/005 |
| 9,285,778 B1* | 3/2016 | Evans ................... G04F 10/005 |
| 9,568,889 B1* | 2/2017 | Lee ........................ G04F 10/005 |
| 9,639,063 B2* | 5/2017 | Dutton .................. G04F 10/005 |

FOREIGN PATENT DOCUMENTS

KR  101031890 B1  5/2011

* cited by examiner

*Primary Examiner* — Brian Young
(74) *Attorney, Agent, or Firm* — Loza & Loza, LLP/Qualcomm

(57) ABSTRACT

Aspects of the disclosure are directed to a pulse to digital converter. In accordance with one aspect, the pulse to digital converter includes an input to receive an input pulse signal; a fractional element, coupled to the input, wherein the fractional element generates a fractional pulse width measurement of the input pulse signal; and an integral element, coupled to the input, wherein the integral element generates an integral pulse width measurement of the input pulse signal, and wherein the fractional pulse width measurement and the integral pulse width measurement are concatenated as an output signal.

30 Claims, 9 Drawing Sheets

700↘

```
Ring[0:7]      →  thermometer[7:0]   →  Binary
=============================================
00001111       →  00000001           →  0
10000111       →  00000011           →  1
11000011       →  00000111           →  2
11100001       →  00001111           →  3
11110000       →  00011111           →  4
01111000       →  00111111           →  5
00111100       →  01111111           →  6
00011110       →  11111111           →  7
00001111       →  00000001           →  0
```

FIG. 7

PULSE TO DIGITAL CONVERTER

TECHNICAL FIELD

This disclosure relates generally to the field of pulse to digital converters, and, in particular, to a pulse to digital converter with fine temporal resolution and temporal range extension.

BACKGROUND

In many electronic circuits, signal processing may be performed in both the analog domain and the digital domain. In this case, a signal in one domain needs to be transformed to a signal in another domain. That is, signals in a first domain may need to be converted to a form suitable for a second domain. A device which serves as an interface between two domains is known as a converter.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a pulse to digital converter. Accordingly, a pulse to digital converter (PDC), including an input to receive an input pulse signal; a fractional element, coupled to the input, wherein the fractional element generates a fractional pulse width measurement of the input pulse signal; and an integral element, coupled to the input, wherein the integral element generates an integral pulse width measurement of the input pulse signal, and wherein the fractional pulse width measurement and the integral pulse width measurement are concatenated as an output signal. The fractional element may include a gated ring oscillator, a binary converter and at least two flip flops, wherein the gated ring oscillator is coupled in series to a first of the at least two flip flops, the first of the at least two flip flops is coupled in series to the binary converter, and the binary converter is coupled in series to a second of the at least two flip flops. In one example, the second of the at least two flip flops outputs the fractional pulse width measurement of the input pulse signal. In one example, the gated ring oscillator is an n-stage ring oscillator which generates m interpolated states using a cascade of m interpolation unit cells, wherein m is an integer greater than n.

In one example, the integral element includes a most significant bit (MSB) counter, a multiplexer and at least two flip flops, wherein the MSB counter includes an extensible quantity of bits, wherein the MSB counter is coupled in series to a first of the at least two flip flops, the first of the at least two flip flops is coupled in series to the multiplexer and the multiplexer is coupled in series to a second of the at least two flip flops. In one example, the second of the at least two flip flops outputs the integral pulse width measurement of the input pulse signal. In one example, a cascade of two registers concatenates the fractional pulse width measurement and the integral pulse width measurement as the output signal. The cascade of two registers may be a cascade of two shift registers. In one example, an anti-glitch circuit may be included to synchronize the input pulse signal with a timing of a gated ring oscillator of the fractional element, wherein the anti-glitch circuit includes a flip flop coupled to a multiplexer and a multiplexer controller for selecting an output of the multiplexer.

Another aspect of the disclosure provides a pulse to digital converter (PDC), including an input to receive an input pulse signal; a fractional element, coupled to the input, the fractional element including a gated ring oscillator coupled in series to a first flip flop, and a binary converter coupled to the first flip flop and a second flip flop to generate a fractional pulse width measurement of the input pulse signal; and an integral element, coupled to the input, the integral element including a most significant bit (MSB) counter coupled to a third flip flop, and a multiplexer coupled to the third flip flop and a fourth flip flop to generate an integral pulse width measurement of the input pulse signal. In one example, the gated ring oscillator is an n-stage ring oscillator which generates m interpolated states using a cascade of m interpolation unit cell, wherein m is an integer greater than n. In one example, an anti-glitch circuit is included to synchronize the input pulse signal with a timing of the gated ring oscillator of the fractional element, wherein the anti-glitch circuit includes the multiplexer coupled to the third flip flop and a multiplexer controller coupled to the multiplexer for selecting an output of the multiplexer to be inputted to the fourth flip flop. In one example, a cascade of two registers is included for concatenating the fractional pulse width measurement and the integral pulse width measurement as an output signal. In one example, the two registers are two shift registers.

Another aspect of the disclosure provides a pulse to digital converter (PDC), including means for receiving an input pulse signal; means for generating a fractional pulse width measurement of the input pulse signal; means for generating an integral pulse width measurement of the input pulse signal; and means for concatenating the fractional pulse width measurement and the integral pulse width measurement as an output signal. In one example, the PDC includes means for synchronizing the input pulse signal with a timing of the means for generating the fractional pulse width measurement. In one example, the PDC includes means for providing a fine temporal resolution of the fractional pulse width measurement.

Another aspect of the disclosure provides a method for pulse width measurement, the method including providing an input pulse signal; generating a fractional pulse width measurement of the input pulse signal; generating an integral pulse width measurement of the input pulse signal; and concatenating the fractional pulse width measurement and the integral pulse width measurement to generate an output signal. In one example, the generating the fractional pulse width measurement is implemented by a gated ring oscillator coupled in series to a first flip flop, and a binary converter coupled to the first flip flop and a second flip flop. In one example, the generating the integral pulse width measurement is implemented by a most significant bit (MSB) counter coupled to a third flip flop, and a multiplexer coupled to the third flip flop and a fourth flip flop. In one example, the concatenating the fractional pulse width measurement and the integral pulse width measurement is implemented by a cascade of two registers. In one example, the cascade of two registers is a cascade of shift registers.

In one example, the method also includes providing a fine temporal resolution of the fractional pulse width measurement. In one example, the method also includes synchronizing the input pulse signal with a timing of the gated ring oscillator, wherein the synchronizing is implemented by the multiplexer coupled to the third flip flop and a multiplexer controller coupled to the multiplexer for selecting an output of the multiplexer. In one example, the gated ring oscillator is an n-stage ring oscillator which generates m interpolated states using a cascade of m interpolation unit cell, wherein m is an integer greater than n. In one example, a pulse generator is used to provide the input pulse signal.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

FIG. 7 illustrates an example of a numeric conversion table used by a binary converter.

DETAILED DESCRIPTION

Figure 1:
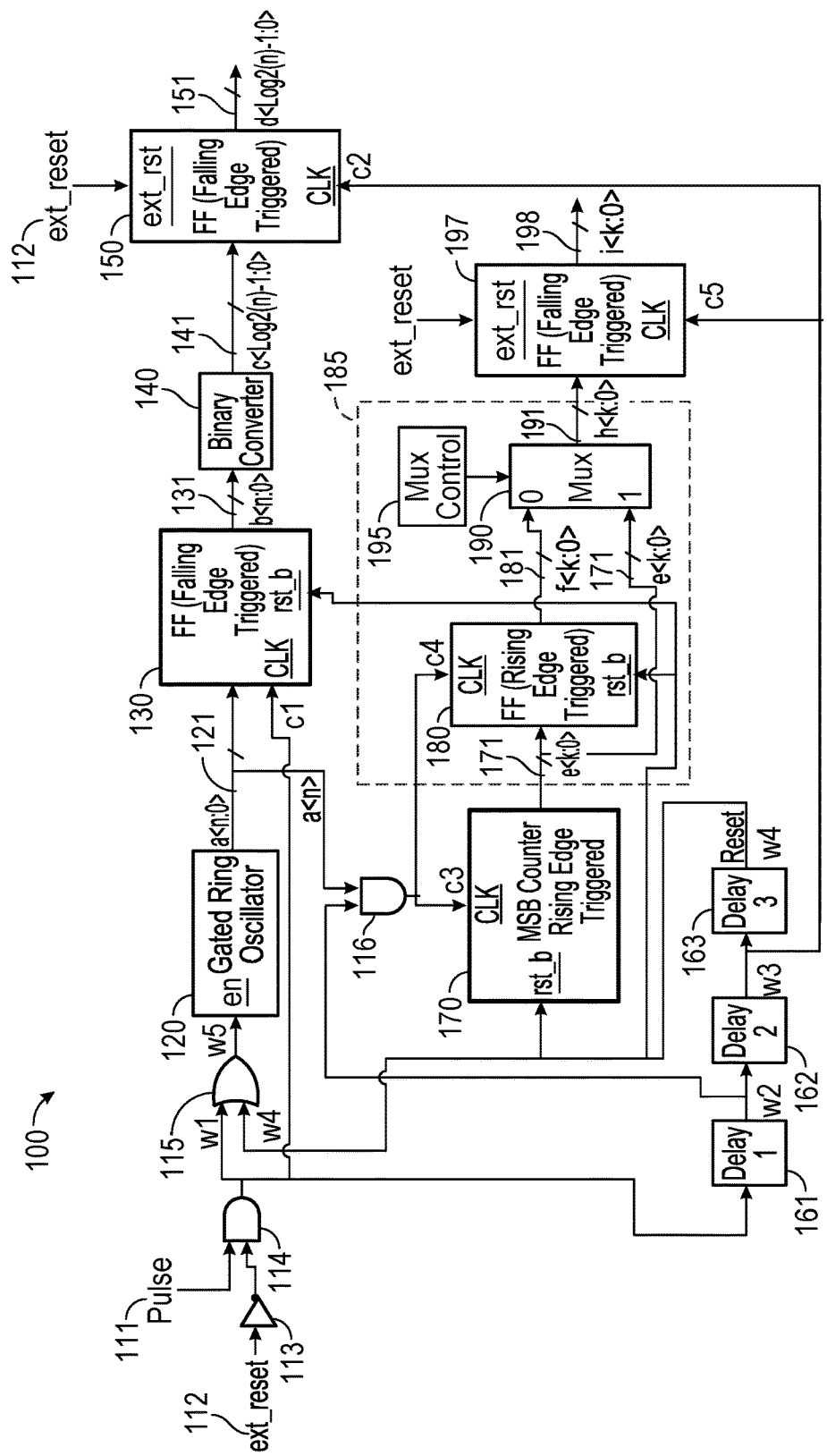
FIG. 1 illustrates an example pulse to digital converter (PDC) in accordance with the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Transforming signals from one domain to another is common in electronic circuits. For example, an analog signal may be transformed to a signal in the digital domain, and vice versa. Signal processing may be performed in both the analog domain and the digital domain. For example, signals in a first domain may need to be converted to a form suitable for a second domain. That is an analog signal may be converted to a digital format, and a digital signal may be converted to an analog format, as needed. A converter serves as an interface between the analog domain and the digital domain.

There are different forms of converters. Disclosed herein is a pulse to digital converter (PDC) which is an electronic circuit for converting a pulse width (e.g., measured in units of time) to a digital representation. The pulse to digital converter (PDC), in one example, may be used in a phase locked loop (PLL) as part of an input comparison circuit for tracking waveform phases. In another example, the PDC may be used in an analog to digital converter (ADC) which converts an analog voltage to a sampled voltage to a time measurement to a digital representation. Although two example implementations are disclosed herein, one skilled in art would understand that the two example implementations are not exclusive and that other implementations of the PDC disclosed here are also within the spirit and scope of the present disclosure.

The linear range of a converter (for example, a pulse to digital converter (PDC)) is defined as an input range of pulse widths having a proportional output range of digital representations. The term "proportional" is defined to mean an incremental change in pulse width results in a proportional incremental change in the digital representation. In some aspects, a converter may have a limited linear range. As disclosed herein, a characteristic of the PDC includes expanding its linear range. Also, characteristics of the PDC include minimizing its footprint (i.e., circuit area) and reducing its consumption of dc power. Thus, described herein is a pulse to digital converter (PDC) with one or more of the following characteristics: improved performance, reduction in footprint or circuit area and/or reduction in dc power consumption overhead. The improved performance may be, for example, increased linear range and/or a finer temporal resolution.

FIG. 1 illustrates an example pulse to digital converter (PDC) 100 in accordance with the present disclosure. As shown in FIG. 1, an input pulse signal 111 and an external reset signal ext_reset 112 serve as inputs to the PDC 100. The input pulse signal 111 and an inverted external reset signal (generated by inverter 113) are sent to a first AND gate 114 to produce a first waveform w1. In one example, the first waveform w1 is generated as a logical AND operation on the input pulse signal 111 and the inverted external reset signal. In one example, the first waveform w1 is a pulsed waveform with pulse width W. Next, the first waveform w1 is sent to a first delay element 161 to produce a second waveform w2. The second waveform w2 is a delayed replica of the first waveform w1. A time delay between the first waveform w1 and the second waveform w2 is given by T1.

Next, the second waveform w2 is sent to a second delay element 162 to produce a third waveform w3. In one example, the third waveform w3 is a delayed replica of the second waveform w2. In one example, a time delay between the second waveform w2 and the third waveform w3 is given by T2. Next, the third waveform w3 is sent to a third delay element 163 to produce a fourth waveform w4. The fourth waveform w4 is a delayed replica of the third waveform w3. In one example, a time delay between the third waveform w3 and the fourth waveform w4 is given by T3. In the example of FIG. 1, the fourth waveform w4 and the first waveform w1 are inputs to an OR gate 115. In one example, the OR gate output is a fifth waveform w5.

As shown in FIG. 1, the fifth waveform w5 is inputted to a gated ring oscillator 120. In one example, the input to the gated ring oscillator 120 serves as an enable signal labeled as "en" in FIG. 1. In one example, the gated ring oscillator 120 outputs a first state word a<n:0> 121. In one example, the first state word a<n:0> 121 includes (n+1) bits. For example, the first state word a<n:0> 121 represents a cumulative count of the gated ring oscillator state transitions. In one example, gated ring oscillator state transitions are state transitions of the gated ring oscillator. State transition is a change of state of a digital electronic circuit. In a digital electronic circuit with two states, the state transition is from LOW to HIGH or HIGH to LOW. In one example, the gated ring oscillator 120 has two states. In one example the gated ring oscillator 120 has an oscillation period T when the input to the gated ring oscillator is HIGH, i.e., enabled.

Next, the first state word a<n:0> 121 may serve as an input to a first flip flop 130. In one example, the first flip flop 130 receives the first waveform w1 which is being used as a first clock signal c1 and the fourth waveform w4 which is being used as a first reset signal labeled in the first flip flop 130 as "rst_b". In one example, the first flip flop 130 is a falling edge-triggered flip flop. In one example, the first flip output is a second state word b<n:0> 131. In one example, the second state word b<n:0> 131 includes (n+1) bits. For example, the second state word b<n:0> 131 may represent a latched cumulative count of the gated ring oscillator state transitions.

Next, the second state word b<n:0> 131 may serve as an input to a binary converter 140. The binary converter may convert phases to thermometer codes and then to binary codes. In one example, the binary converter 140 converts the second state word b<n:0> 131 to a thermometer code and then to a binary code. The binary converter 140 output is a third state word c<log2(n)–1:0> 141. In one example, the third state word c<log2(n)–1:0> 141 includes log2(n) bits. For example, the third state word c<log2(n)=1:0> 141 may represent a binary cumulative count of the gated ring oscillator state transitions.

Next, the third state word c<log2(n)–1:0> 141 may serve as an input to a second flip flop 150. In one example, the second flip flop 150 receives the third waveform w3 which is being used as a second clock signal c2 and the second flip flop 150 also receives a second reset signal (labeled in the second flip flop 150 as "ext_rst") from the external reset signal ext_reset 112. In one example, the second flip flop 150 is a falling edge-triggered flip flop. In one example, the second flip flop output is a fourth state word d<log2(n)–1:0> 151. In one example, the fourth state word d<log2(n)–1:0> 151 includes log2(n)bits. For example, the fourth state word d<log2(n)–1:0> 151 represents a synchronized binary cumulative count of the gated ring oscillator state transitions.

In one example, a fractional element of the pulse to digital converter (PDC) 100 includes the gated ring oscillator 120, the first flip flop 130, the binary converter 140, and the second flip flop 150. For example, the fractional element uses internal interpolated states of the gated ring oscillator state transitions to measure pulse width of the input pulse signal 111 as fractions of the oscillation period T to produce a fractional measurement given by the fourth state word d<log2(n)–1):0> 151. The fractional element provides a fractional pulse width measurement of the input pulse signal 111. In one example, the fractional pulse width measurement provides a fine temporal resolution of pulse width measurement of the input pulse signal 111. In one example, the fine temporal resolution is measured against the temporal resolution of a gated ring oscillator without an interpolator.

In addition, for example, the first state word a<n:0> 121 and the second waveform w2 are inputted to a second AND gate 116. The second AND gate 116 may generate a clock signal shown as a third clock signal c3 and a fourth clock signal c4. In one example, the third clock signal c3 and the fourth clock signal c4 are the same clock signal. The third clock signal c3 serves as a clock input to a most significant bit (MSB) counter 170. In one example, the MSB counter 170 is triggered on a rising edge of the third clock signal c3. In addition, the MSB counter 170 may receive the fourth waveform w4 which is used as a third reset signal labeled in the MSB counter 170 as "rst_b". In one example, the MSB counter 170 output is a fifth state word e<k:0> 171. In one example, the fifth state word e<k:0> 171 includes (k+1) bits. For example, the fifth state word e<k:0> 171 represents a MSB count of the gated ring oscillator MSB transitions. In one example, the MSB transitions of the gated ring oscillator are state changes of the most significant bit (MSB) of the first state word a<n:0> 121 from a HIGH state to a LOW state.

Since the first state word a<n:0> 121 is derived from the fractional element of the PDC, and since the clock input to the MSB counter 170 is derived from the first state word a<n:0> 121 (through the second AND gate 116), the clock input to the MSB counter 170 is derived from the fractional element of the PDC 100. Thus, there is a coupling between the fractional element and the integral element of the PDC 100 through the third clock signal c3.

Next, the fifth state word e<k:0> 171 serves as an input to a third flip flop 180. In one example, the third flip flop 180 receives the fourth clock signal c4 from the second AND gate 116 and the third flip flop 180 receives the fourth waveform w4 which is used as a fourth reset signal labeled in the third flip flop 180 as "rst_b". In one example, the third flip flop 180 is a falling edge-triggered flip flop. In one example, the third flip flop 180 output is a sixth state word f<k:0> 181. In one example, the sixth state word f<k:0> 181 includes (k+1) bits. For example, the sixth state word f<k:0> 181 may represent a latched MSB count of the gated ring oscillator MSB transitions.

Next, the fifth state word e<k:0> 171 may serve as a first input and the sixth state word f<k:0> 181 may serve as a second input to a multiplexer 190. The output of the multiplexer 190 may be selected by a multiplexer controller 195. In one example, the multiplexer 190 uses a comparison logic to select the multiplexer output. In one example, the multiplexer controller 195 may compare the fifth state word e<k:0> 171 and the sixth state word f<k:0> 181 using the comparison logic to select the output of the multiplexer 190. In one example, the multiplexer controller 195 may use the following comparison logic to select the multiplexer output:

if (f<k:0>=e<k:0>) then mux control=1, or
if (f<k:0>≠e<k:0>) then:
   if a<(n+1)/2−1>=1 then mux control=0 or
   if a<(n+1)/2−1>=0 then mux control =1.

In this example, mux control=0 selects the output to be the second input to multiplexer 190 and mux control=1 selects the output to be the first input to multiplexer 190. Also, in this example, a<(n+1)/2−1> represents a middle bit of the first state word a<n:0> 121 which has (n+1 ) bits. For example, if n=7, then the first state word a<(n+1 )/2−1>=a<3>, a middle bit.

In one example, the multiplexer 190 outputs a seventh state word h<k:0> 191. In one example, the seventh state word h<k:0> 191 includes (k+1) bits. For example, the seventh state word h<k:0> 191 represents a selected latched MSB count of the gated ring oscillator MSB transitions.

Next, the seventh state word h<k:0> 191 may serve as an input to a fourth flip flop 197. In one example, the fourth flip flop 197 receives the third waveform w3 which is used as a fifth clock signal c5 and the fourth flip flop 197 receives a fifth reset signal (labeled in the fourth flip flop 197 as "ext_rst") from the external reset signal ext_reset 112. In one example, the fourth flip flop 197 is a falling edge-triggered flip flop. In one example, the fourth flip flop 197 output is an eighth state word i<k:0> 198. In one example, the eighth state word i<k:0> 198 includes (k+1) bits. For example, the eighth state word i<k:0> 198 represents a synchronized MSB count of the gated ring oscillator MSB transitions.

In one example, an integral element of the pulse to digital converter (PDC) 100 includes the MSB counter 170, the third flip flop 180, the multiplexer 190 and the fourth flip flop 197. The MSB counter 170 along with the third flip flop 180, the multiplexer 190 and the fourth flip flop 197 provide increased linear range of pulse width measurement of the input pulse signal 111. For example, the integral element uses MSB transitions of the gated ring oscillator state transitions to measure pulse width of the input pulse signal 111 as multiples of the oscillation period T to produce an integral measurement given by the eighth state word i<k:0> 198. The integral element provides an integral pulse width measurement of the input pulse signal 111. In one example, the integral pulse width measurement provides a temporal range of pulse width measurement of the input pulse signal 111 that may be widened by adding an extensible q quantity of bits to the MSB counter; that is, a wider temporal range. In one example, q is an integer.

In one example, the output of the pulse to digital converter (PDC) 100 may be represented as a concatenation of the synchronized MSB count of the gated ring oscillator MSB transitions and the synchronized binary cumulative count of the gated ring oscillator state transitions. In one example, the output of the PDC 100 may be expressed as $\{i<k:0>, d<\log_2(n)-1:0>\}$ where $\{x,y\}$ denotes the concatenation of state word x and state word y. In one example, concatenation is the joining of two ordered elements into a larger single ordered element. In one example, the concatenation may be implemented by a cascade of two registers, for example, two shift registers.

In one example, an anti-glitch circuit 185 of the PDC 100 includes the third flip flop 180, the multiplexer 190 and the multiplexer controller 195. The anti-glitch circuit synchronizes the input pulse signal 111 with the timing of the gated ring oscillator 120. That is, if more than one counter bit is changing state at the same clock transition, the multiplexer controller 195 compares a current counter state with a previous counter state to eliminate a counter transition ambiguity. The anti-glitch circuit 185 obtains a monotonic input-output relationship to avoid problems associated with the asynchronicity between the input pulse signal 111 and the timing of the gated ring oscillator 120. The components of the anti-glitch circuit 185 are shown within a dashed rectangle in FIG. 1.

Figure 2:
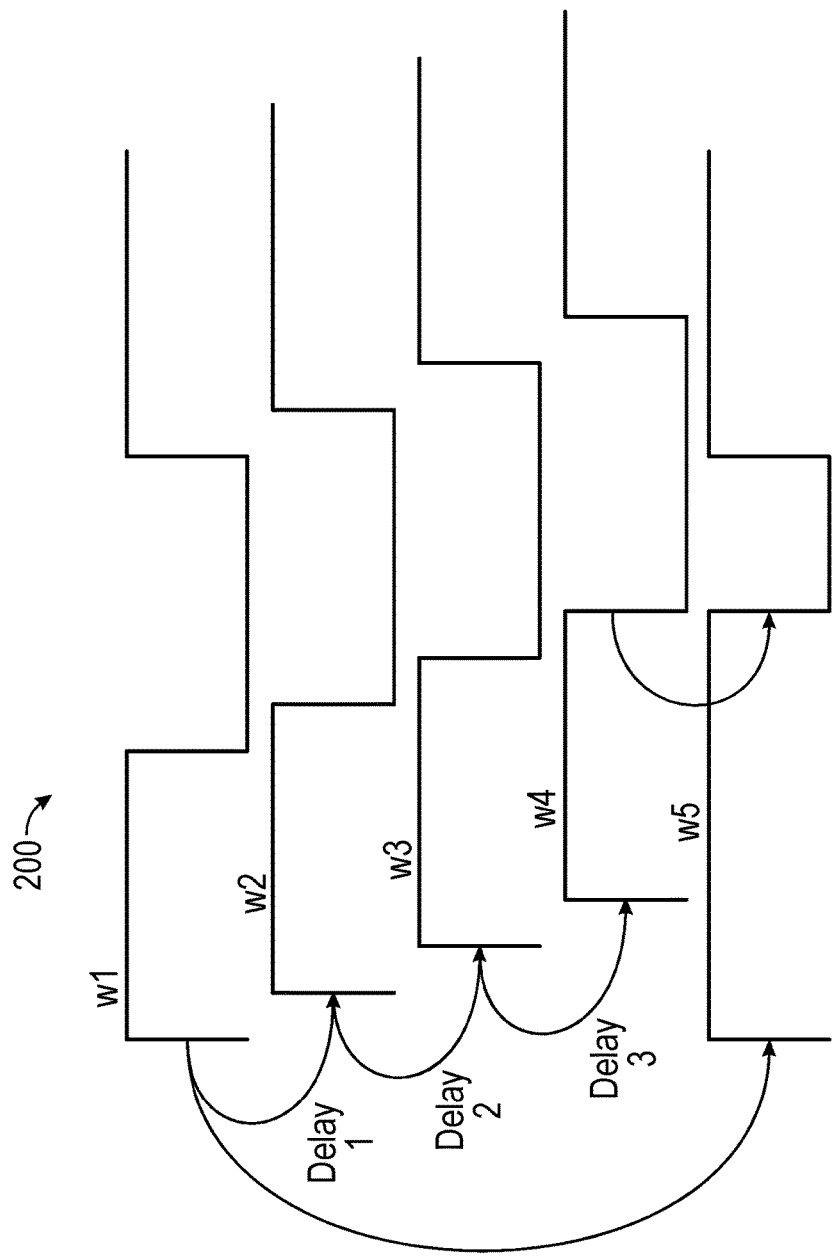
FIG. 2 illustrates an example of a timing diagram for the pulse to digital converter (PDC) illustrated in FIG. 1.

FIG. 2 illustrates an example of a timing diagram 200 for the pulse to digital converter (PDC) 100 illustrated in FIG. 1. In one example, the first trace is the first waveform w1, the second trace is the second waveform w2, the third trace is the third waveform w3, the fourth trace is the fourth waveform w4 and the fifth trace is the fifth waveform w5. In one example, the gated ring oscillator 120 is enabled and disabled by the fifth waveform w5.

Figure 3:
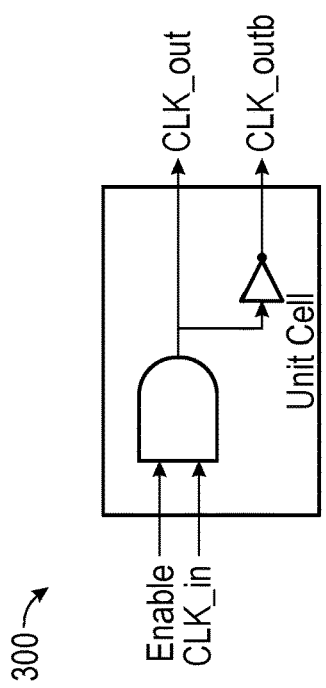
FIG. 3 illustrates an example unit cell of the gated ring oscillator.

FIG. 3 illustrates an example unit cell 300 of the gated ring oscillator 120. In one example, the unit cell has two inputs, an enable signal and an input clock signal clk_in. For example, when the enable signal is HIGH, the unit cell is activated, and when the enable signal is LOW, the unit cell is deactivated. When the enable signal is HIGH, an output clock signal clk_out is generated. In one example, the output clock signal clk_out is a delayed version of the input clock signal clk_in. That is, the output clock signal clk_out is a replica of the input clock signal clk_in with a relative time delay tau ($\tau$). In addition, when the enable signal is HIGH, a complementary output clock signal clk_outb is generated. In one example, the complementary output clock signal clk_outb is an inverted replica of the input clock signal clk_in with a relative complementary time delay taub ($\tau b$). In one example, tau ($\tau$) is equal to taub ($\tau b$).

Figure 4:
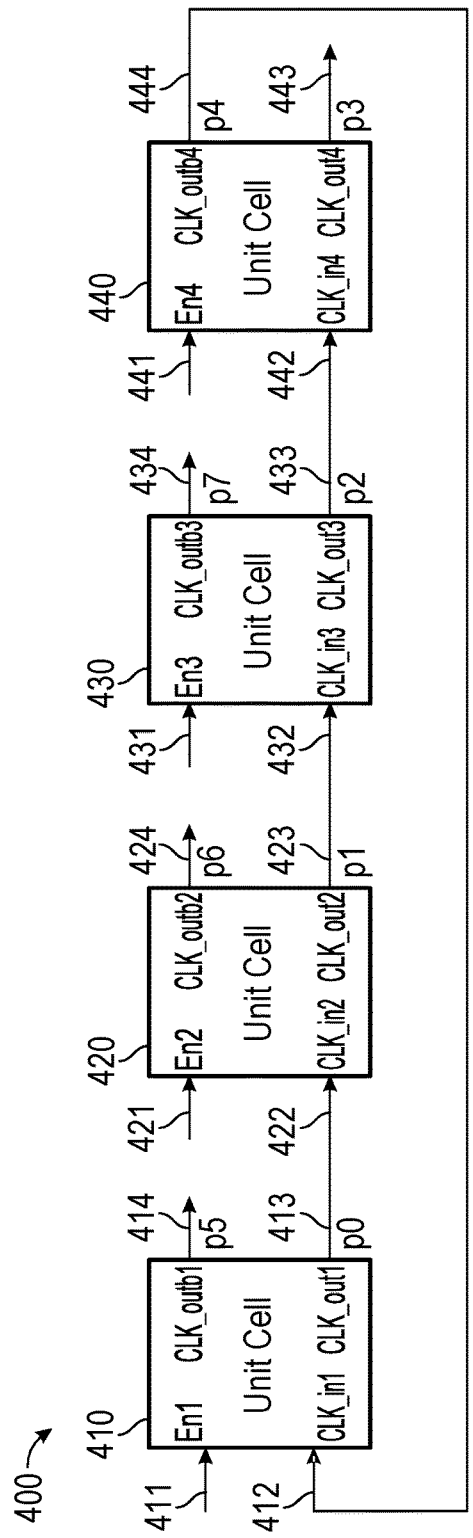
FIG. 4 illustrates an example of a four-stage gated ring oscillator having 8 states.

FIG. 4 illustrates an example of a four-stage gated ring oscillator 400 having 8 states. A ring oscillator may include a serial cascade of delay stages, for example, four stages as illustrated in FIG. 4. An example of a delay stage is a unit cell, for example, the unit cell 300 illustrated in FIG. 3. In this example, the four-stage gated ring oscillator 400 includes a serial cascade of four unit cells. A first unit cell 410 has a first enable input en1 411 and a first input clock signal clk_in1 412. The first unit cell 410 has a first output clock signal clk_out1 413, denoted as p0, and a first complementary output clock signal clk_outb1 414, denoted as p5.

A second unit cell 420 has a second enable input en2 421 and a second input clock signal clk_in2 422. The second unit cell 420 has a second output clock signal clk_out2 423, denoted as p1, and a second complementary output clock signal clk_outb2 424, denoted as p6. As shown in FIG. 4, the first output clock signal clk_out1 413 is the same as the second input clock signal clk_in2 422.

A third unit cell 430 has a third enable input en3 431 and a third input clock signal clk_in3 432. The third unit cell 430 has a third output clock signal clk_out3 433, denoted as p2, and a third complementary output clock signal clk_outb3 434, denoted as p7. As shown in FIG. 4, the second output clock signal clk_out2 423 is the same as the third input clock signal clk_in3 432.

A fourth unit cell 440 has a fourth enable input en4 441 and a fourth input clock signal clk_in4 442. The fourth unit cell 440 has a fourth output clock signal clk_out4 443, denoted as p3, and a fourth complementary output clock signal clk_outb4 444, denoted as p4. As shown in FIG. 4, the third output clock signal clk_out3 433 is the same as the fourth input clock signal clk_in4 442.

In one example, the four-stage gated ring oscillator 400 is configured such that the first output clock signal clk_out1 413 is connected to the second input clock signal clk_in2 422, the second output clock signal clk_out2 423 is connected to the third input clock signal clk_in3 432, the third output clock signal clk_out3 433 is connected to the fourth input clock signal clk_in4 442, and the fourth complementary output clock signal clk_out4 444 is connected to the first input clock signal clk_in1 412. In this configuration, for example, the four-stage gated ring oscillator 400 will oscillate at a frequency which is inversely proportional to the relative time delay tau ($\rho$) of each unit cell. That is, as the relative time delay tau ($\rho$) decreases, the frequency increases.

Figure 5:
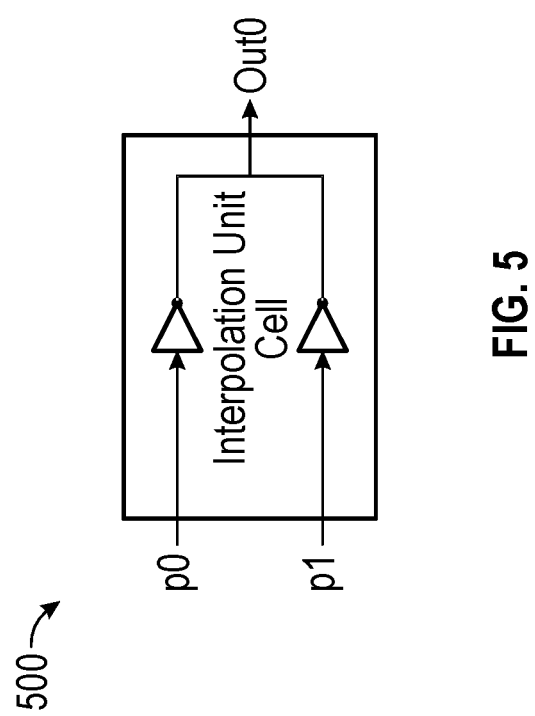
FIG. 5 illustrates an example of an interpolation unit cell with two inputs and one output.

A temporal resolution of a ring oscillator may be limited by the relative time delay tau ($\rho$). In one example, the temporal resolution may be improved, that is, made finer through interpolation. For example, FIG. 5 illustrates an example of an interpolation unit cell 500 with two inputs p0 and p1 and one output out0. In one example, the output out0 is an interpolated value between the two inputs p0 and p1. In one example, the interpolated value is a weighted average of the two inputs.

Figure 6:
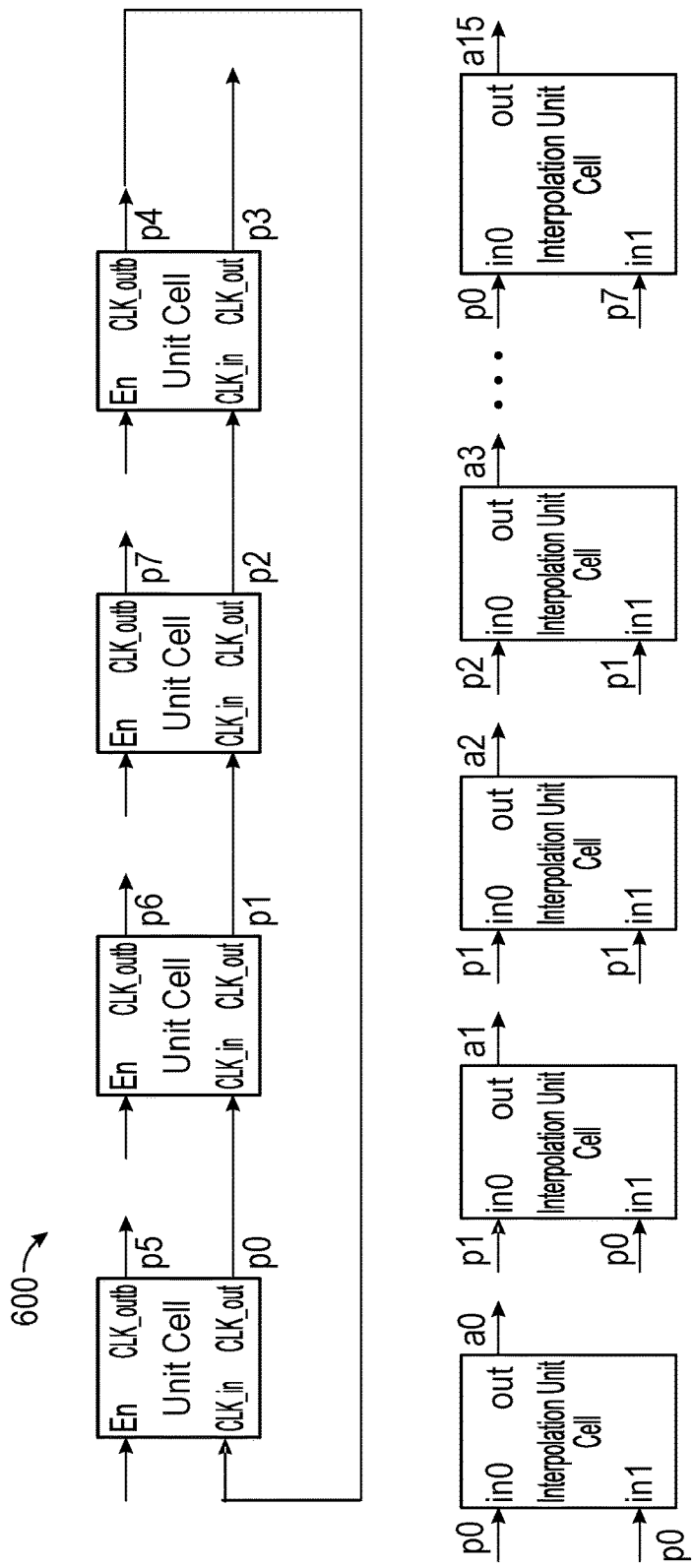
FIG. 6 illustrates an example of a four-stage gated ring oscillator with an interpolator.

FIG. 6 illustrates an example of a four-stage gated ring oscillator with an interpolator 600. The four-stage gated ring oscillator with an interpolator 600 includes a cascade of interpolation unit cells, for example, similar to the interpolation unit cell 500 illustrated in FIG. 5. In one example, the four-stage ring oscillator is the same as that illustrated in FIG. 4, with an addition of the interpolator. In one example, the interpolator accepts outputs from an n-stage ring oscillator and generates m interpolated states using a cascade of m interpolation unit cells, wherein m is an integer greater than n. In one example, both m and n are integers. In one example, a four-stage ring oscillator generates sixteen (16) interpolated states by using a cascade of sixteen interpolation unit cells. In one example, the interpolator is a digital interpolator. That is, the interpolator (through its cascade of interpolation unit cells) provides a finer temporal resolution of the pulse width measurement (i.e., the fractional pulse width measurement) of the input pulse signal.

FIG. 7 illustrates an example of a numeric conversion table 700 used by a binary converter, for example, the binary converter 140 shown in FIG. 1. In this example, the second state word b<n:0>, which is an input to the binary converter (e.g. binary converter 140), includes 8 bits (i.e., n=7). The first column of the example numeric conversion table, labeled as "Ring [0:7]", lists possible values for the second state word b<n:0>. The second column shows a first conversion from the second state word b<n:0> to a thermometer code. In one example, a thermometer code with N bits is a unary code which represents a natural number Q with Q sequential ones and (N-Q) zeros. The third column shows a second conversion from the thermometer code to a binary code. In one example, the binary code may be expressed in decimal form as a set of non-negative integers. In one example, the binary code is the third state word c<log2(n)−1:0> 141. In one example, the third state word c<log2(n)−1:0> 141 includes log2(n) bits.

In one example, an anti-glitch circuit (e.g., anti-glitch circuit 185 shown in FIG. 1) may be added to the PDC to synchronize the input pulse signal (e.g., input pulse signal 111) with the timing of the gated ring oscillator (e.g. gated ring oscillator 120). For example, the anti-glitch circuit may obtain a monotonic input-output relationship to avoid timing glitches associated with the asynchronicity between the input pulse signal and the timing of the gated ring oscillator. In one example, a gated ring oscillator with 8 bits may result in the second state word b<n:0> having values shown by the first column of FIG. 7. In one example, the thermometer code may be represented by a thermometer digital word therm<n:0> with (n+1) bits. For example, the first conversion from the second state word b<n:0> to the thermometer code may be modified by using certain bits from the second state word b<n:0> and generating a modified thermometer code modtherm<n:0>. For example, a third bit b[3] and a seventh bit b[7] of the second state word b<n:0> may be used to generate the modified thermometer code. In one example, the modified thermometer code may be denoted by modtherm<n:0>={t<n:0>}, where t<n:0> includes (n+1) bits.

In one example, the modified thermometer code may be determined by the following modification logic:
if b[3]=0, then modtherm<n:0>={0000,b[2],b[1],b[0],1}
if b[3]=1, then modtherm<n:0>={b[6],b[5],b[4],11111}.
In one example, to avoid timing issues or mismatches, the modification logic may be revised by:
if (b[3]=0 & b[7]|b[6]=1), then modtherm<n:0>={0000, b[2],b[1],b[0],1}
if (b[3]=1, then modtherm<n:0>={b[6],b[5],b[4],11111}.
In one example, the modification logic may be expanded to check on other bits from the second state word b<n:0> as well. In the modification examples, the "&" notation denotes a logical AND operation, and the "|" denotes a logical OR operation.

Figure 8:
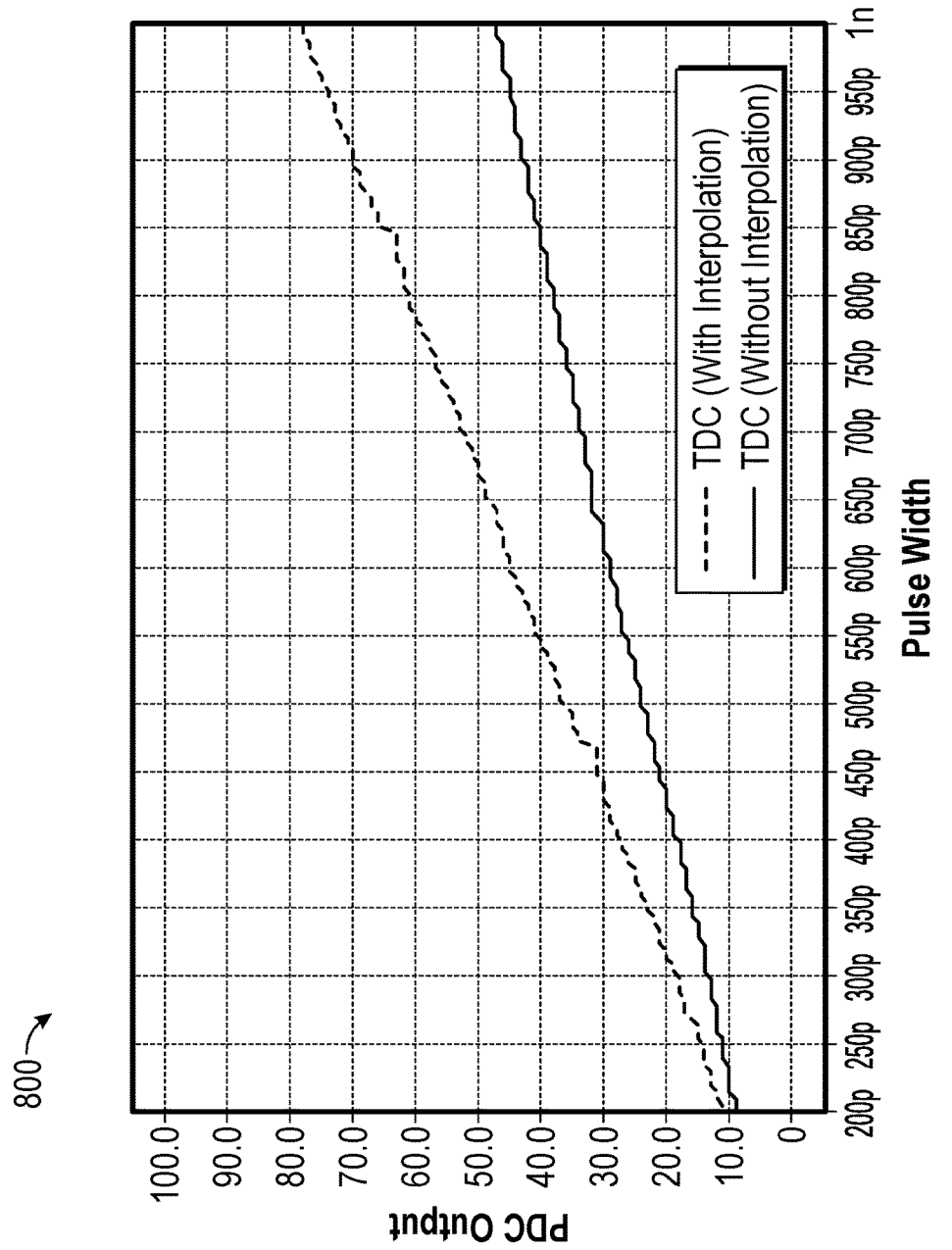
FIG. 8 illustrates an example graph of pulse widths versus pulse to digital converter outputs with and without interpolation.

FIG. 8 illustrates an example graph 800 of pulse widths versus pulse to digital converter outputs with and without interpolation. In FIG. 8, the pulse width of an input pulse signal is shown on the horizontal axis and the pulse to digital converter output is shown on the vertical axis for two cases: with and without interpolation. In FIG. 8, the lower trace shows the pulse to digital converter output without interpolation. The upper trace shows the pulse to digital converter output with interpolation. As illustrated by the graph 800, the output of the pulse to digital converter with interpolation has a finer temporal resolution and a wider range than the output of the pulse to digital converter without interpolation.

Figure 9:
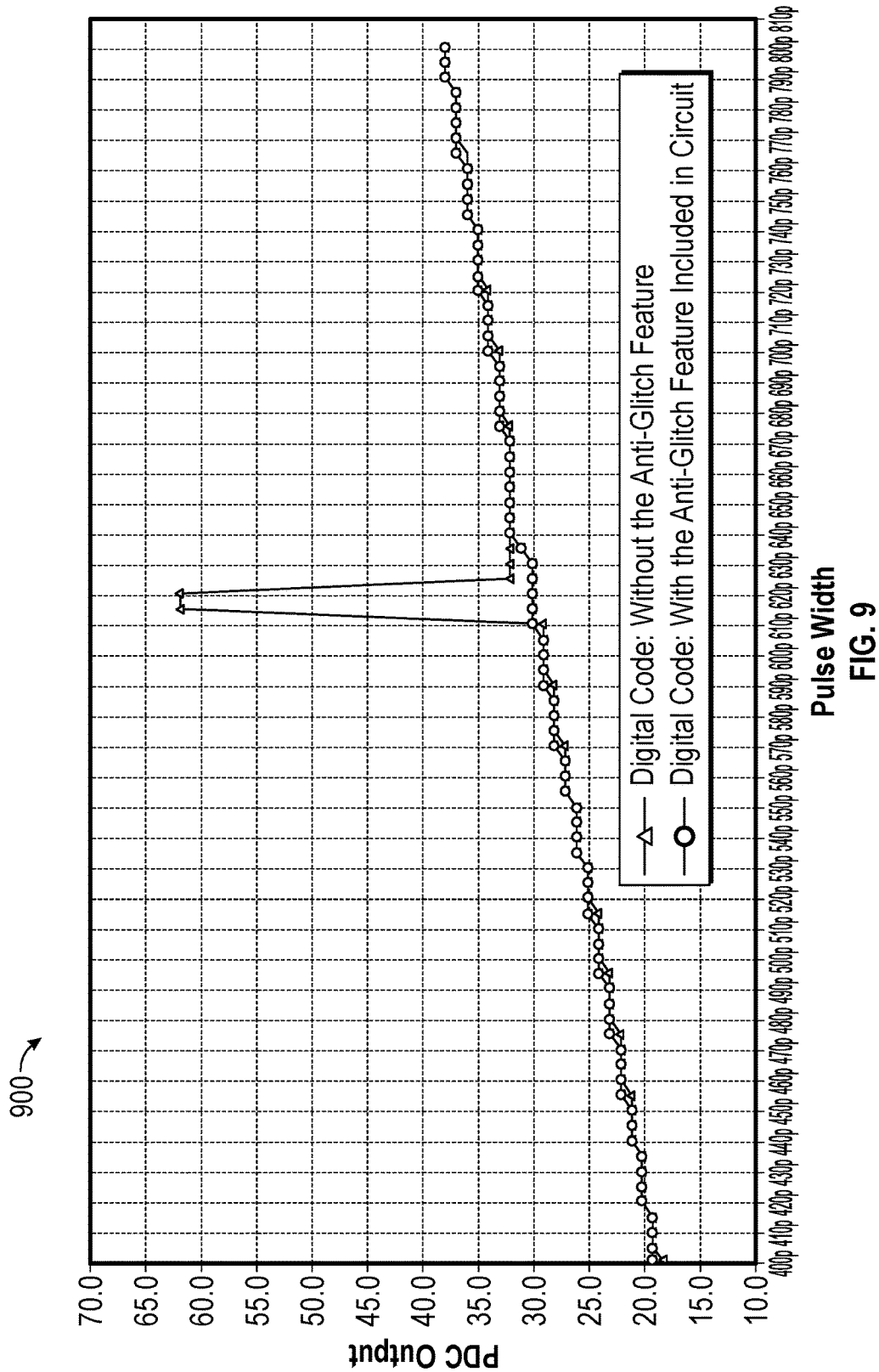
FIG. 9 illustrates an example graph of pulse widths versus pulse to digital converter outputs with and without anti-glitch.

FIG. 9 illustrates an example graph 900 of pulse widths versus pulse to digital converter outputs with and without anti-glitch. In FIG. 9 the pulse width of an input pulse signal is presented on the horizontal axis and the pulse to digital converter output is presented on the vertical axis shows the for two cases: with and without anti-glitch. In FIG. 9, the lower trace shows the output of a pulse to digital converter with an anti-glitch circuit, and the upper trace shows the output of a pulse to digital converter without an anti-glitch circuit. In the lower trace example, the output of the pulse to digital converter with the anti-glitch circuit shows a monotonic input-output relationship. In the upper trace example, the output of the pulse to digital converter without an anti-glitch circuit shows a non-monotonic input-output relationship with an output glitch in the middle of the input-output relationship.

In accordance with the present disclosure, the pulse to digital converter (PDC) may include at least three features which provide certain improved performances: (1) using an MSB counter to increase linear range of pulse width measurements, (2) using a digital interpolator within a gated ring oscillator to obtain a fine temporal resolution of pulse width measurements, and (3) using an anti-glitch circuit to obtain a monotonic input-output relationship to avoid problems associated with the asynchronicity between the input pulse signal and the gated ring oscillator timing.

For example, an input pulse signal to be measured serves as an input to the PDC. The input pulse signal enables an n-stage gated ring oscillator when the input pulse signal transitions from LOW to HIGH. In one example, the PDC may be characterized with two sections: a fractional element and an integral element. For example, the fractional element may include a gated ring oscillator, a first flip flop (FF), a binary converter, and a second flip flop (FF) to represent the measurement as a binary value with $\log_2(n)$ bits. The gated ring oscillator may be augmented with an interpolator (e.g., a digital interpolator) to increase the number of oscillator states to provide a fine temporal resolution for the fractional measurement d<.>. In one example, the interpolator includes a cascade of interpolation unit cells.

In one example, the integral element uses a (k+1) bit most significant bit (MSB) counter to measure pulse width as integer counts of the oscillator clock period to produce an integral measurement i<k:0> with (k+1) bits. The integral element may include the MSB counter, a first flip flop (FF), a multiplexer and a second flip flop (FF). The integral element may provide increased linear range of pulse width measurement of the input pulse signal. In one example, pulse width measurements are completed when the input pulse signal transitions from HIGH to LOW. The fractional measurement d<.> and the integral measurement i<.> are then combined as a concatenated measurement output ={i<k:0>, d<log2(n)−1):0>}. The term "concatenated" is defined as the joining of two separate measurements together in a specified order. For example, the integral measurement may represent the most significant bits (MSB) of the pulse width measurement and the fractional measurement represents the least significant bits (LSB) of the pulse width measurement.

Figure 10:
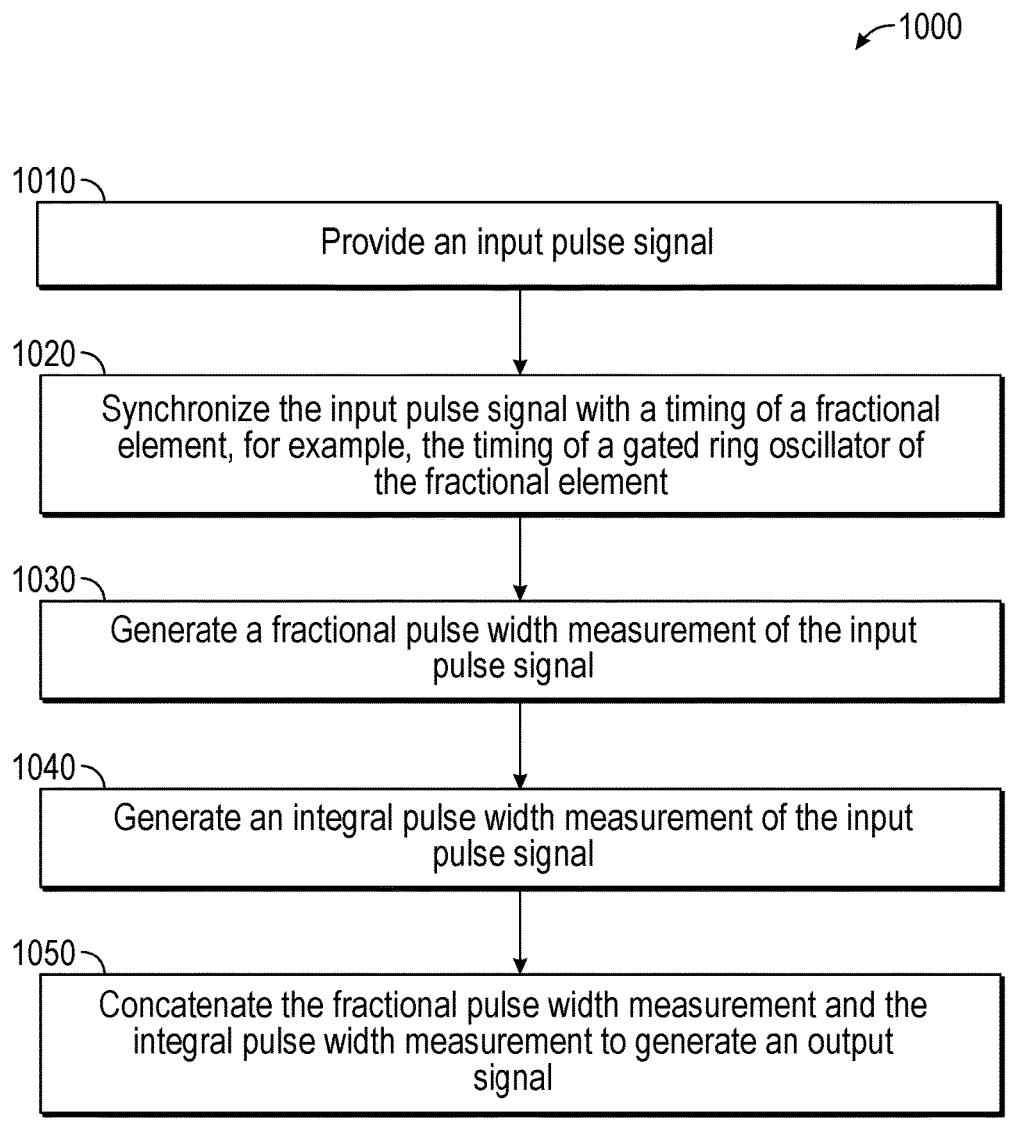
FIG. 10 illustrates an example flow diagram for providing pulse width measurements.

FIG. 10 illustrates an example flow diagram 1000 for providing pulse width measurements. In block 1010, provide an input pulse signal. In one example, a pulse generator may be used to provide the input pulse signal. In block 1020, synchronize the input pulse signal with a timing of fractional element, for example, the timing of a gated ring oscillator of a fractional element. In one example, the synchronizing is implemented by a multiplexer coupled to a flip flop and a multiplexer controller coupled to the multiplexer for selecting an output of the multiplexer.

In block 1030, generate a fractional pulse width measurement of the input pulse signal. In one example, the fractional pulse width measurement is generated by a gated ring oscillator coupled in series to a first flip flop, and a binary converter coupled to the first flip flop and a second flip flop. In one aspect, generating the fractional pulse width measurement may include providing a fine temporal resolution of the fractional pulse width measurement. The fine temporal resolution may be achieved through an interpolator within the gated ring oscillator. For example, a four-stage ring oscillator may be used to generate sixteen (16) interpolated states through the use of an interpolator, wherein the interpolator includes a cascade of sixteen interpolation unit cells to achieve the 16 interpolated states.

In block 1040, generate an integral pulse width measurement of the input pulse signal. In one example, the integral pulse width measurement is generated by a most significant bit (MSB) counter coupled to a third flip flop, and a multiplexer coupled to the third flip flop and a fourth flip flop. In one example, the multiplexer and the third flip flop are also used for the synchronizing disclosed in block 1020.

In block 1050, concatenate the fractional pulse width measurement and the integral pulse width measurement to generate an output signal. In one example, a cascade of two registers is used to concatenate the fractional pulse width measurement and the integral pulse width measurement. In another example, a cascade of two shift registers is used to concatenate the fractional pulse width measurement and the integral pulse width measurement.

In one aspect, one or more of the steps for providing pulse width measurements in FIG. 10 may be executed by one or more processors which may include hardware, software, firmware, etc. In one aspect, one or more of the steps in FIG. 10 may be executed by one or more processors which may include hardware, software, firmware, etc. The one or more processors, for example, may be used to execute software or firmware needed to perform the steps in the flow diagram of FIG. 10. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in the processing system, external to the processing system, or distributed across multiple entities including the processing system. The computer-readable medium may be embodied in a computer program product. By way of example, a computer program product may include a computer-readable medium in packaging materials. The computer-readable medium may include software or firmware for pulse width measurements. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first die may be coupled to a second die in a package even though the first die is never directly physically in contact with the second die. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A pulse to digital converter (PDC), comprising:
   an input to receive an input pulse signal;
   a fractional element, coupled to the input, wherein the fractional element generates a fractional pulse width measurement of the input pulse signal using one or more interpolated states; and
   an integral element, coupled to the input, wherein the integral element generates an integral pulse width measurement of the input pulse signal, and wherein the fractional pulse width measurement and the integral pulse width measurement are concatenated as an output signal.

2. A pulse to digital converter (PDC) comprising:
   an input to receive an input pulse signal;
   a fractional element, coupled to the input, wherein the fractional element generates a fractional pulse width measurement of the input pulse signal, and wherein the fractional element comprises a gated ring oscillator, a binary converter and at least two flip flops; and
   an integral element, coupled to the input, wherein the integral element generates an integral pulse width measurement of the input pulse signal, and wherein the fractional pulse width measurement and the integral pulse width measurement are concatenated as an output signal.

3. The pulse to digital converter (PDC) of claim 2, wherein the gated ring oscillator is coupled in series to a first of the at least two flip flops, the first of the at least two flip flops is coupled in series to the binary converter, and the binary converter is coupled in series to a second of the at least two flip flops.

4. The pulse to digital converter (PDC) of claim 3, wherein the second of the at least two flip flops outputs the fractional pulse width measurement of the input pulse signal.

5. The pulse to digital converter (PDC) of claim 4, wherein the gated ring oscillator is an n-stage ring oscillator which generates m interpolated states using a cascade of m interpolation unit cells, wherein m is an integer greater than n.

6. The pulse to digital converter (PDC) of claim 1, wherein the integral element comprises a most significant bit (MSB) counter, a multiplexer and at least two flip flops, wherein the MSB counter includes an extensible quantity of bits.

7. The pulse to digital converter (PDC) of claim 6, wherein the MSB counter is coupled in series to a first of the at least two flip flops, the first of the at least two flip flops is coupled in series to the multiplexer and the multiplexer is coupled in series to a second of the at least two flip flops.

8. The pulse to digital converter (PDC) of claim 7, wherein the second of the at least two flip flops outputs the integral pulse width measurement of the input pulse signal.

9. The pulse to digital converter (PDC) of claim 1, further comprising a cascade of two registers to concatenate the fractional pulse width measurement and the integral pulse width measurement as the output signal.

10. The pulse to digital converter (PDC) of claim 1, further comprising an anti-glitch circuit to synchronize the input pulse signal with a timing of a gated ring oscillator of the fractional element.

11. The pulse to digital converter (PDC) of claim 10, wherein the anti-glitch circuit comprises a flip flop coupled to a multiplexer and a multiplexer controller for selecting an output of the multiplexer.

12. A pulse to digital converter (PDC), comprising:
    an input to receive an input pulse signal;
    a fractional element, coupled to the input, the fractional element comprising a gated ring oscillator coupled in series to a first flip flop, and a binary converter coupled to the first flip flop and a second flip flop to generate a fractional pulse width measurement of the input pulse signal; and
    an integral element, coupled to the input, the integral element comprising a most significant bit (MSB) counter coupled to a third flip flop, and a multiplexer coupled to the third flip flop and a fourth flip flop to generate an integral pulse width measurement of the input pulse signal.

13. The pulse to digital converter (PDC) of claim 12, wherein the gated ring oscillator is an n-stage ring oscillator which generates m interpolated states using a cascade of m interpolation unit cell, wherein m is an integer greater than n.

14. The pulse to digital converter (PDC) of claim 13, further comprising an anti-glitch circuit to synchronize the input pulse signal with a timing of the gated ring oscillator of the fractional element.

15. The pulse to digital converter (PDC) of claim 14, wherein the anti-glitch circuit comprises the multiplexer coupled to the third flip flop and a multiplexer controller coupled to the multiplexer for selecting an output of the multiplexer to be inputted to the fourth flip flop.

16. The pulse to digital converter (PDC) of claim 15, further comprising a cascade of two registers for concatenating the fractional pulse width measurement and the integral pulse width measurement as an output signal.

17. The pulse to digital converter (PDC) of claim 16, wherein the two registers are two shift registers.

18. A pulse to digital converter (PDC) comprising:
means for receiving an input pulse signal;
means for generating a fractional pulse width measurement of the input pulse signal using one or more interpolated states;
means for generating an integral pulse width measurement of the input pulse signal; and
means for concatenating the fractional pulse width measurement and the integral pulse width measurement as an output signal.

19. A pulse to digital converter (PDC) comprising
means for receiving an input pulse signal;
means for generating a fractional pulse width measurement of the input pulse signal;
means for generating an integral pulse width measurement of the input pulse signal;
means for concatenating the fractional pulse width measurement and the integral pulse width measurement as an output signal; and
means for synchronizing the input pulse signal with a timing of the means for generating the fractional pulse width measurement.

20. The pulse to digital converter (PDC) of claim 19, further comprising means for providing a fine temporal resolution of the fractional pulse width measurement.

21. A method for pulse width measurement, the method comprising:
providing an input pulse signal;
generating a fractional pulse width measurement of the input pulse signal using one or more interpolated states;
generating an integral pulse width measurement of the input pulse signal; and
concatenating the fractional pulse width measurement and the integral pulse width measurement to generate an output signal.

22. A method for pulse width measurement, the method comprising:
providing an input pulse signal;
generating a fractional pulse width measurement of the input pulse signal, wherein the generating the fractional pulse width measurement is implemented by a gated ring oscillator coupled in series to a first flip flop, and a binary converter coupled to the first flip flop and a second flip flop;
generating an integral pulse width measurement of the input pulse signal; and
concatenating the fractional pulse width measurement and the integral pulse width measurement to generate an output signal.

23. The method of claim 22, wherein the generating the integral pulse width measurement is implemented by a most significant bit (MSB) counter coupled to a third flip flop, and a multiplexer coupled to the third flip flop and a fourth flip flop.

24. The method of claim 23, wherein the concatenating the fractional pulse width measurement and the integral pulse width measurement is implemented by a cascade of two registers.

25. The method of claim 24, wherein the cascade of two registers is a cascade of shift registers.

26. The method of claim 24, further comprising providing a fine temporal resolution of the fractional pulse width measurement.

27. The method of claim 26, further comprising synchronizing the input pulse signal with a timing of the gated ring oscillator.

28. The method of claim 27, wherein the synchronizing is implemented by the multiplexer coupled to the third flip flop and a multiplexer controller coupled to the multiplexer for selecting an output of the multiplexer.

29. The method of claim 28 wherein the gated ring oscillator is an n-stage ring oscillator which generates m interpolated states using a cascade of m interpolation unit cell, wherein m is an integer greater than n.

30. The method of claim 21, wherein a pulse generator is used to provide the input pulse signal.

* * * * *